United States Patent
Hausmann

[11] Patent Number: 5,880,923
[45] Date of Patent: Mar. 9, 1999

[54] METHOD AND APPARATUS FOR IMPROVED RETENTION OF A SEMICONDUCTOR WAFER WITHIN A SEMICONDUCTOR WAFER PROCESSING SYSTEM

[75] Inventor: Gilbert Hausmann, Santa Clara, Calif.

[73] Assignee: Applied Materials Inc., Santa Clara, Calif.

[21] Appl. No.: 871,741

[22] Filed: Jun. 9, 1997

[51] Int. Cl.[6] .................................................... H02N 13/00
[52] U.S. Cl. ............................................ 361/234; 279/128
[58] Field of Search ................... 361/234, 233; 279/128

[56] References Cited

U.S. PATENT DOCUMENTS

| | | | |
|---|---|---|---|
| 4,184,188 | 1/1980 | Briglia | 361/234 |
| 4,384,918 | 5/1983 | Abe | 156/643 |
| 4,692,836 | 9/1987 | Suzuki | 361/234 |
| 5,001,594 | 3/1991 | Bobbio | 361/234 |
| 5,179,498 | 1/1993 | Hongoh et al. | 361/234 |
| 5,350,479 | 9/1994 | Collins et al. | 156/345 |
| 5,452,177 | 9/1995 | Frutiger | 361/234 |
| 5,535,507 | 7/1996 | Barnes et al. | 361/234 |

FOREIGN PATENT DOCUMENTS

WO 88/09054  11/1988  WIPO .

*Primary Examiner*—Fritz Fleming
*Attorney, Agent, or Firm*—Thomason and Moser

[57] ABSTRACT

Method and apparatus for retaining a semiconductor wafer upon a pedestal within semiconductor wafer processing equipment. An electrostatic chuck contains a wafer support having a surface. Embedded beneath the surface is a number of electrodes defining a number of chucking zones. The electrodes are energized by a number of non-zero voltages thereby creating a variable, non-zero chucking force in each of the chucking zones. The method of retaining a substrate to a substrate support consists of biasing at least one of the electrodes with a first voltage of a first magnitude and biasing each previously unbiased electrode with a voltage of unequal magnitude of the initially biased electrode and every other previously unbiased electrode such that a non-zero chucking force exists in every zone. Wafer chucking zones of differing force improve uniformity of heat transfer gas layer distribution.

13 Claims, 4 Drawing Sheets

5,880,923

METHOD AND APPARATUS FOR IMPROVED RETENTION OF A SEMICONDUCTOR WAFER WITHIN A SEMICONDUCTOR WAFER PROCESSING SYSTEM

BACKGROUND OF THE INVENTION

1. Field of the Invention

The invention relates generally to an apparatus and a concomitant method for retaining a workpiece within a semiconductor wafer processing system and, more specifically, to an improved electrostatic chuck that provides zones of varying chucking force to reduce heat transfer gas leakage, and improve heat transfer gas layer uniformity beneath the workpiece.

2. Description of the Background Art

Electrostatic chucks are used for retaining a workpiece in various applications ranging from holding a sheet of paper in a computer graphics plotter to holding a semiconductor wafer within a semiconductor wafer process chamber. Although electrostatic chucks vary in design, they all are based on the principle of applying a voltage to one or more electrodes in the chuck so as to induce opposite polarity charges in the workpiece and electrodes, respectively. The electrostatic attractive force between the opposite charges presses the workpiece against the chuck, thereby retaining the workpiece.

In semiconductor wafer processing equipment, electrostatic chucks are used for clamping wafers to a pedestal during processing. Since the materials and processes used to process a wafer are extremely temperature sensitive, temperature control is an important aspect of wafer processing. Should the materials be exposed to excessive temperature fluctuations resulting from poor heat transfer during processing, performance of the wafer process may be compromised resulting in wafer damage. As such, the pedestal may form a chucking electrode as well as a heat sink or heater as used in etching, physical vapor deposition (PVD) or chemical vapor deposition (CVD) applications.

To optimally transfer heat between the wafer and pedestal, a very large, nearly uniform electrostatic force is used in an attempt to cause the greatest amount of wafer surface to physically contact a support surface of the chuck. However, due to surface roughness of both the wafer and the chuck, small interstitial spaces remain between the chuck and wafer that reduce contact area and thus reduce optimal heat transfer. To improve heat transfer during processing, an inert heat transfer gas is pumped into the volume formed by the interstitial spaces between the support surface of the chuck and the wafer. This gas acts as a thermal heat transfer medium from the wafer to the chuck that has better heat transfer characteristics than the vacuum it replaces.

Since the distribution of heat transfer gas to the interstitial spaces is osmotic and the interstitial spaces may not be interconnected, some spaces do not receive any heat transfer gas. This condition leads to a non-uniform temperature profile across the backside of the wafer during processing and results in wafer damage. The uniformity of the chucking force serves to compound the problem as the wafer is held in place evenly across the support surface. Since effective and uniform heat transfer from the wafer is an important aspect of the manufacturing process, maximizing wafer exposure to the heat transfer gas contributes to the greatest heat transfer rate.

In addition to maximizing wafer exposure to the heat transfer gas, minimizing leakage of the heat transfer gas is also a wafer processing concern. Traditionally, the electrostatic chuck or the pedestal which supports the chuck contains an outer diameter raised rim. The rim is approximately the same diameter as that of the semiconductor wafer. As such, the wafer is supported at its outer edge by this rim. When an electrostatic clamping force is applied to the chuck, the wafer is pulled down to the support surface effectively creating a seal on the backside of the wafer at the rim. As discussed previously, a heat transfer gas into the process chamber is introduced to the backside of the wafer to improve heat conduction away from the wafer. Unfortunately, gas pressure drops significantly at the edge of clamped wafer because the volume of the interstitial spaces increases as the radius of the wafer increases. Additionally, a large amount of heat transfer gas leakage is known to occur at the rim. The clamping force pulls the wafer down while pressure from the heat transfer gas on the backside of the wafer pushes the wafer up causing the wafer to flex during processing. These opposing forces reduce the area of the wafer that is in contact with the rim. If the wafer is not seated properly on the support surface, a sudden reduction in chucking force occurs or a sudden increase in heat transfer gas pressure occurs due to an anomaly during wafer processing, substantial leakage of the heat transfer gas occurs at the reduced contact area.

Existing art in electrostatic chucks is limited by the uniform chucking force that chucks the wafer to the support surface. The uniform chucking force dictates that the wafer will be subject to the same downward force across the entire support surface regardless of characteristic weaknesses (i.e., reduced contact at the outer diameter rim and non-uniformity of heat transfer gas diffusion in some interstitial spaces) of the chuck. Two examples of such apparatus are disclosed in U.S. Pat. Nos. 4,384,918 issued May 24, 1983 to Abe and 5,452,177 issued Sep. 19, 1995 to Frutinger.

Therefore, there is a need in the art for an improved apparatus for retaining a wafer that modulates electrostatic chucking force across the support surface. Greater force is applied where it is needed most and reduced where uniform heat transfer gas diffusion would otherwise be inhibited. As such, temperature uniformity across the bottom surface of the wafer is attained.

SUMMARY OF THE INVENTION

The disadvantages heretofore associated with the prior art are overcome by an inventive configuration of an electrostatic chuck used for retaining semiconductor wafers in semiconductor wafer processing equipment. The electrostatic chuck contains a wafer support having a surface. Beneath the surface of the wafer support is a number of electrodes arranged and defining a number of chucking zones. The electrodes are energized by a number of DC voltages thereby creating a different chucking force in each of the chucking zones. Also, the invention includes a method of retaining a substrate upon a substrate support comprising the steps of biasing at least one of the electrodes with a first voltage of a first magnitude and biasing each previously unbiased electrode with a voltage of unequal magnitude of the initially biased electrode and every other previously unbiased electrode such that a different chucking force exists in every zone.

By creating wafer chucking zones of unequal force, nonuniform heat transfer gas layer formation is greatly reduced. Specifically, the amount of force applied to a particular area of the wafer is controlled. For example, a greater force is applied at the wafer edge where heat transfer gas leakage occurs and a lesser force is applied near the center where excessive force can prevent heat transfer gas diffusion into interstitial regions. Customizing the chucking force across the backside of the wafer provides increased heat transfer gas uniformity and thus promotes temperature uniformity across the wafer.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
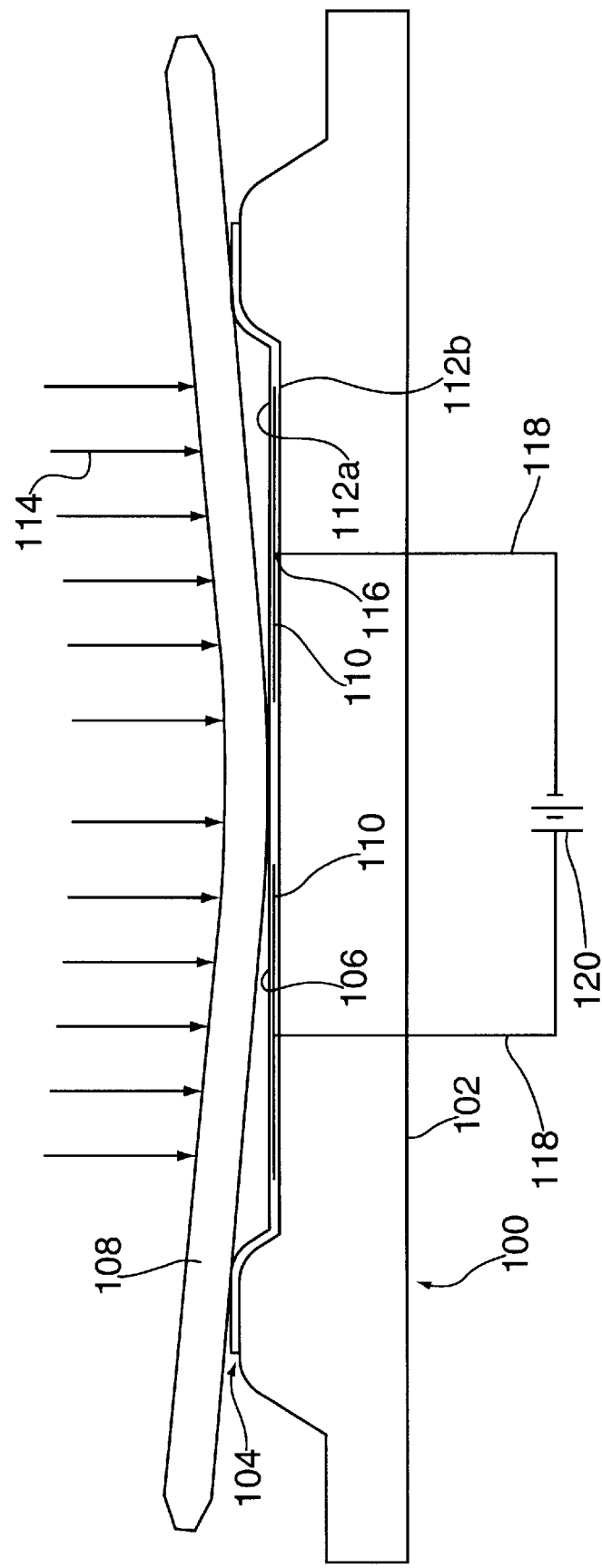
FIG. 1 is a cross-sectional view of a prior art electrostatic chuck assembly with a semiconductor wafer clamped to a support surface.

FIG. 1 depicts a cross-sectional view of a conventional electrostatic chuck assembly 100 used in supporting and clamping semiconductor wafers in a reaction chamber (not shown) during processing. Specifically, the electrostatic chuck assembly contains a pedestal 102 supporting an electrostatic chuck 104. The operation of a conventional electrostatic chuck is disclosed in U.S. Pat. No. 5,350,479 issued Sep. 27, 1994 to Applied Materials, Inc. of Santa Clara, Calif. The electrostatic chuck 104 has one or more electrodes 110 sandwiched between two dielectric layers 112a and 112b to transform electrical power into an electrostatic clamping force 114. For the bipolar electrostatic chuck depicted in FIG. 1, electrical power is supplied to the chuck via conductors 118 electrically connected to the electrodes 110 and a power supply 120. The dielectric is a semi-pliant material, typically polyimide, adhered to a top surface 116 of the pedestal 102. Alternately, the chuck can be a ceramic slab with electrodes embedded beneath the surface. A top surface 106 of the electrostatic chuck 104 in turn supports a substrate material 108, typically a semiconductor wafer.

The chucking force of a given electrostatic chuck is defined by the equation $$F = \frac{\kappa A V^2}{2d^2}$$

where A is the area of the electrodes, V is the voltage drop between the electrode and the backside of the wafer, d is the thickness of the dielectric layer and κ is the dielectric constant of the dielectric material. Thus, the chucking force is strongly affected by the potential difference between the electrode and the backside of the wafer. As seen from FIG. 1, the chucking force is created by a difference in potential between two electrodes of a bipolar chuck. That is, equal and opposite charges across each of the electrodes establish an electric field through the dielectric material and across a portion of the chuck surface. This electric field induces charges to migrate to the backside of the wafer and electrostatically clamp the wafer to the chuck.

Figure 2:
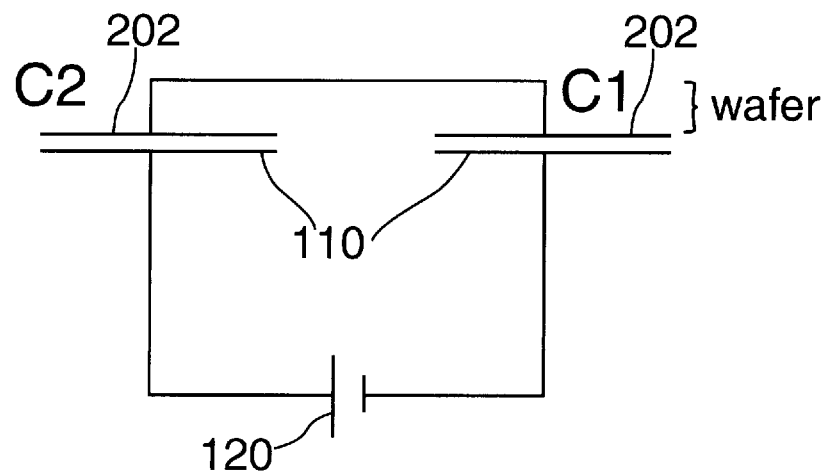
FIG. 2 is a schematic representational view of the equivalent circuit created by the prior art electrostatic chuck assembly of FIG. 1.

FIG. 2 is a schematic representation of the equivalent circuit of a wafer clamped to a bipolar chuck. Each electrode 110 and a portion of the wafer backside 202 form the plates of each capacitor $C_1$ and $C_2$. The capacitance between the plates is determined by the dielectric constant κ of the dielectric material between the electrode and wafer. The chucking force created by one electrode at, for example, potential $V_1$ and the backside of the wafer at potential $V_b$ is $$F = \frac{\kappa A (V_b - V_1)^2}{2d^2}.$$

Generally, the electrodes are maintained at equal but opposite voltages to induce equal force on each half of the wafer.

Figure 3:
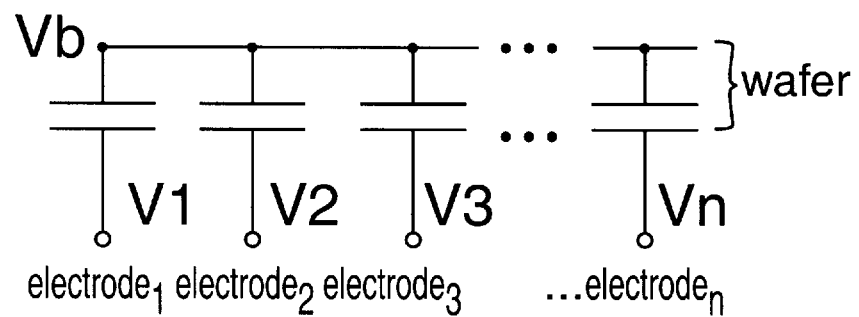
FIG. 3 is a schematic representational view of the equivalent circuit created by the present invention.

Because the wafer is an effective conductor of the charge accumulated on the wafer backside, $V_b$ is substantially constant across the entire wafer backside. The invention introduces additional electrodes at varying potentials to create various chucking zones across the electrostatic chuck. FIG. 3 is an equivalent circuit having voltages $V_1, V_2 \ldots V_n$ applied to the additional electrodes. Electrode placement and applied voltage can be strategically determined and altered to increase chucking force in a zone where it is most needed and decrease where excessive force is detrimental to wafer processing.

Figure 4:
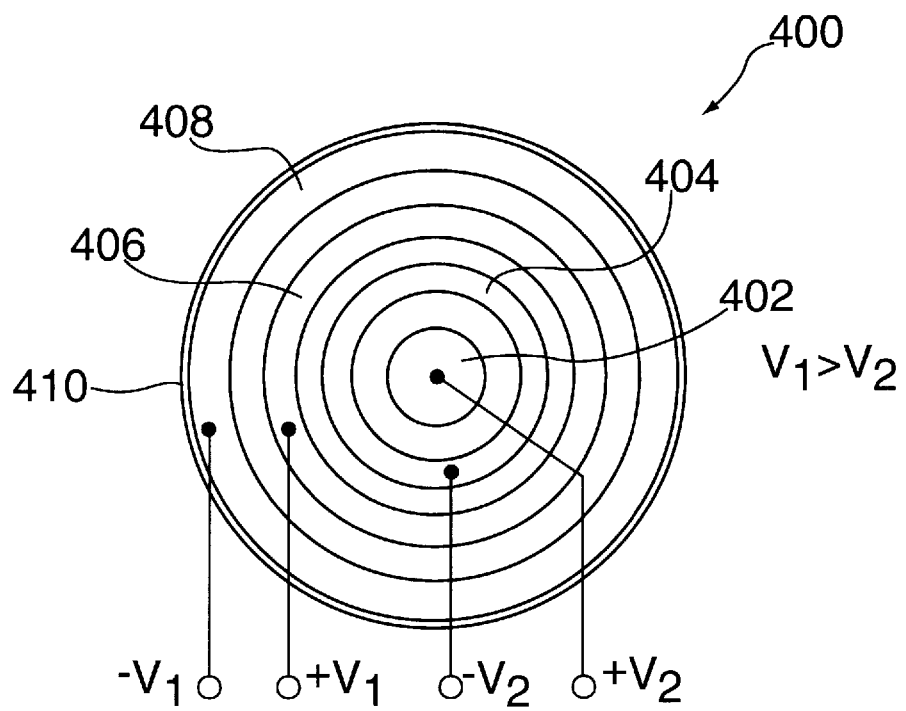
FIG. 4 is a top view of a first embodiment of the apparatus of the present invention.

FIG. 4 depicts one embodiment of the present invention having a concentric ring electrode arrangement 400 to form a customized bipolar electrostatic chuck. A first set of electrodes 406 and 408 are arranged concentrically about the electrostatic chuck near the edge 410 of the chuck forming one chucking zone. A second set of electrodes 402 and 404 are arranged concentrically about the electrostatic chuck and radially inward of the first set forming a second chucking zone. As this configuration is for a bipolar chuck, one electrode from the first set is biased positively with DC voltage $V_1$ and the other electrode is biased negatively with the same magnitude voltage. In order to achieve different chucking forces in the different zones across the electrostatic chuck, the second set of electrodes is biased with a different DC voltage $V_2$. Preferably $V_1 > V_2$ so that a greater chucking force is applied at the edge of the chuck where heat transfer gas has been known to leak into the chamber. $V_2$ provides sufficient force to retain the wafer but not an excessive force that blocks diffusion of the heat transfer gas throughout the interstitial spaces under the wafer. The different DC voltages may come from different power supplies or from the same power supply that is capable of delivering different voltages (i.e., a transformer tapped at various locations on the output coil).

Figure 5:
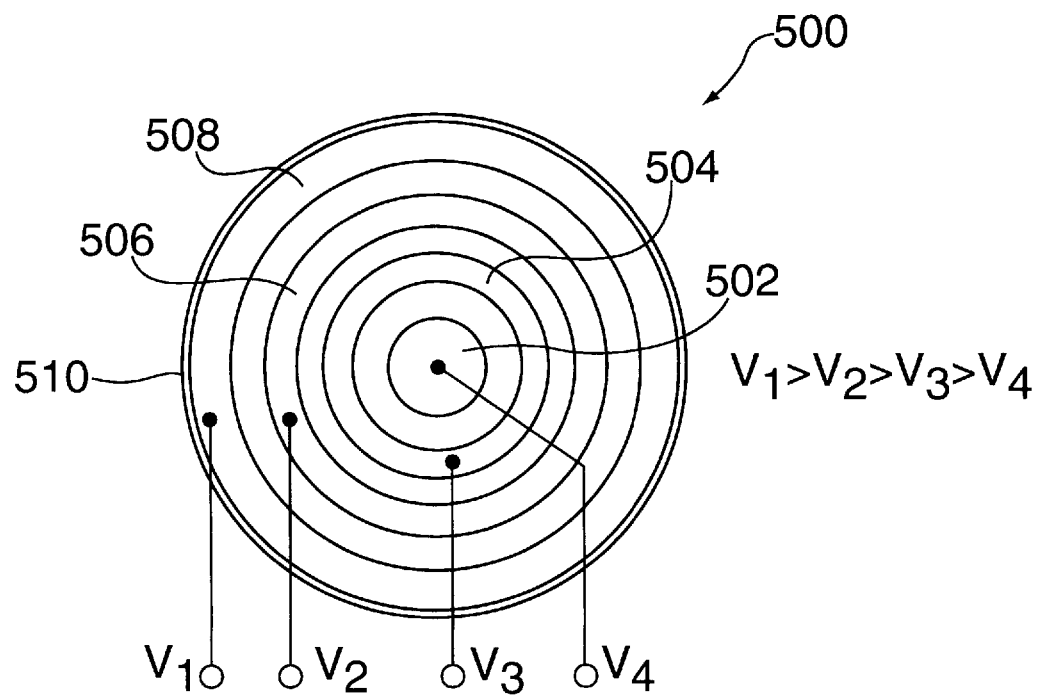
FIG. 5 is a top view of a second embodiment of the apparatus of the present invention.

Although the above described configuration discusses a specific bipolar electrode configuration, those skilled in the art of electrostatic chuck manufacturing can devise a variety of other configurations suitable to their own needs that incorporate these teachings. For example, a monopolar chuck includes a plurality monopolar electrodes forming a plurality of chucking zones at various voltage levels to further customize the chucking force profile. FIG. 5 depicts such a monopolar chuck 500 as a second embodiment of the invention. Specifically, each of the concentric ring electrodes 502, 504, 506 and 508 is biased at respectively different voltage levels $V_1$, $V_2$, $V_3$ and $V_4$. Preferably, $V_1>V_2>V_3>V_4$ so that the greatest chucking force exists at the chuck edge.

Figure 6:
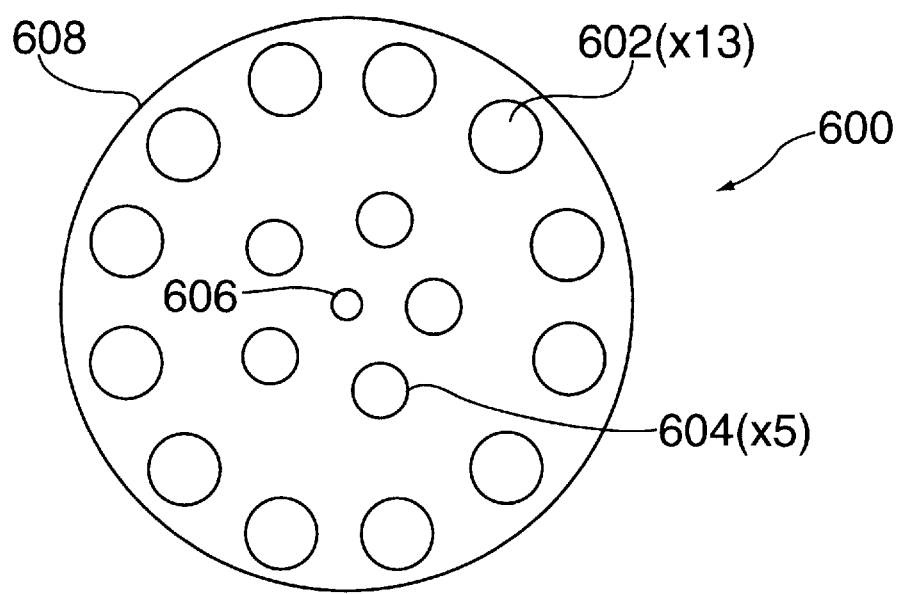
FIG. 6 is a top view of a third embodiment of the apparatus of the present invention.

Alternately, a plurality of electrode pads can create a desired chucking force profile. FIG. 6 depicts another embodiment wherein a number (e.g., nineteen) of pads (602, 604 and 606) form the chucking zones. Each pad is biased with a different voltage thereby pulling the wafer down with greatest force at the pad with the highest applied voltage. If heat transfer gas leakage is detected at a certain location along the chuck edge, the biasing on the electrodes nearest the leak can be altered to clamp the wafer with greater force in this location without losing seal integrity at other points along the edge.

Additionally, as stated in the electrostatic force equation above, the area A of the electrode is also a factor in determining chucking force. As such, the electrode pattern can be designed with varying size electrodes with different or the same voltage applied to create the unequal chucking force profile. As again seen in FIG. 6, the pads have different size diameters. Specifically, larger diameter pads 602 are located at the outer edge 608 of the chuck 600 to provide a strong chucking force. Smaller diameter pads 604 are located inwards of the larger pads where a reduced chucking force is adequate. The smallest pad 606 is located in the center where the chucking force is still capable of clamping the wafer to the support surface, but does not restrict diffusion of heat transfer gas to interstitial spaces proximate the center of the support surface.

Although maintaining thermal integrity at the edge of the wafer is discussed as a major advantage of the subject invention, multiple chucking zones can prove useful in other types of applications. For example, multiple chucking zones can enhance the chucking capability of non-flat surfaces. Specifically, spherical- or dome-shaped pedestals need a greater chucking force at their edge where a wafer tends to bow away from the chuck surface. The novel apparatus can be designed in any of the configurations described above or in any other manner by those skilled in the art to facilitate wafer edge clamping to facilitate use of a shaped pedestal.

In sum, the creation of wafer chucking zones of unequal force in an electrostatic chuck provides a solution to the problem of nonuniform heat transfer gas layer formation beneath the backside of a semiconductor wafer during wafer processing. Nonuniformity of the heat transfer gas layer, caused by a variety of physical and environmental reasons, is eliminated by controlling the amount of force applied to a particular area of the wafer. For example, a greater force is applied at the wafer edge where heat transfer gas leakage is the source for non-uniformity of the heat transfer gas layer. A lesser force is applied near the center where excessive force can prevent heat transfer gas diffusion into interstitial regions. Customizing the chucking force across the backside of the wafer provides increased heat transfer gas uniformity and thus uniformity of the temperature across the wafer. Achieving greater temperature uniformity of the wafer results in a better quality and higher yield end product.

Although various embodiments which incorporate the teachings of the present invention have been shown and described in detail herein, those skilled in the art can readily devise many other varied embodiments that still incorporate these teachings.

What is claimed is:

1. Apparatus for improved clamping of a semiconductor wafer in a semiconductor wafer processing system comprising:

a wafer support having a surface a plurality of electrodes embedded beneath the surface of the wafer support, comprising an outermost set of large diameter pads, an intermediate set of medium diameter pads and a center set of at least one small diameter pad, said electrodes being arranged to define a plurality of chucking zones where each electrode in said plurality of chucking zones is energized by a different, variable DC voltage thereby creating a different chucking force in each of the chucking zones.

2. Apparatus for improved clamping of a semiconductor wafer in a semiconductor wafer processing system comprising:

a wafer support having a surface, a plurality of electrodes embedded beneath the surface of the wafer support and arranged to define a plurality of chucking zones where each electrode in said plurality of chucking zones is energized by a different DC voltage thereby creating a different chucking force in each of the chucking zones wherein the plurality of electrodes further comprises a first electrode set disposed near an outer edge of the wafer support and a second electrode set located radially inward of the first electrode set wherein the first electrode set is biased with a voltage that is greater than a voltage biasing the second electrode set so as to not restrict diffusion of a heat transfer gas proximate the second inner concentric ring electrode.

3. The apparatus of claim 1 wherein each DC voltage is variable to control the chucking force in each chucking zone.

4. The apparatus of claim 2 wherein the first and second electrode sets are concentric rings.

5. The apparatus of claim 1 wherein the plurality of electrodes further comprises concentric rings.

6. The apparatus of claim 5 wherein the plurality of concentric ring electrodes is four.

7. The apparatus of claim 6 wherein each concentric ring electrode is biased with a different voltage.

8. The apparatus of claim 7 wherein the voltage biasing an outermost concentric ring electrode is greater than voltages biasing inner concentric ring electrodes.

9. The apparatus of claim 1 wherein the plurality of electrodes further comprises an outermost set of large diameter pads, an intermediate set of medium diameter pads and a center set of at least one small diameter pad.

10. Apparatus for improved clamping of a semiconductor wafer in a semiconductor wafer processing system comprising:

a wafer support having a surface, four concentric ring electrodes embedded beneath the surface of the wafer support and arranged to define four chucking zones on the wafer support, the four concentric ring electrodes energized by four different DC voltages respectively thereby creating a different chucking force in each of the chucking zones, where the voltage biasing an outermost concentric ring electrode is greater than the voltage biasing a next inner concentric ring electrode, the voltage biasing the next inner concentric ring electrode is greater than the voltage biasing a second inner concentric ring electrode, and the voltage biasing the second inner concentric ring electrode is greater than the voltage biasing an innermost concentric ring electrode so as to not restrict diffusion of a heat transfer gas proximate the second inner concentric ring electrode.

11. A method of retaining a substrate upon a substrate support, the substrate support having a plurality of electrodes embedded within the substrate support, the plurality of electrodes defining a plurality of variable force chucking zones wherein the plurality of electrodes further comprises a first electrode set disposed near an outer edge of the wafer support and a second electrode set located radially inward of the first electrode set, the method comprising the steps of:

biasing at least one of the electrodes of the first electrode set with a first DC voltage of a first magnitude, and biasing at least one of the electrodes from the second electrode set with a DC voltage of lesser magnitude of the initially biased electrode and every other previously unbiased electrode such that a different chucking force exists in every zone having a biased electrode.

12. The method of claim 11 further comprising the step of adjusting the voltage of at least one of the electrodes in response to a change in heat transfer gas layer uniformity.

13. The method of claim 11 further comprising the step of adjusting the voltage of at least one of the electrodes to optimize temperature uniformity.

* * * * *